United States Patent
Singh

(10) Patent No.: US 7,149,869 B2
(45) Date of Patent: Dec. 12, 2006

(54) METHOD AND APPARATUS FOR GENERATING GENERIC DESCRAMBLED DATA PATTERNS FOR TESTING ECC PROTECTED MEMORY

(75) Inventor: Amandeep Singh, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 342 days.

(21) Appl. No.: 10/448,835

(22) Filed: May 30, 2003

(65) Prior Publication Data

US 2004/0243784 A1     Dec. 2, 2004

(51) Int. Cl.
*G06F 12/00* (2006.01)
(52) U.S. Cl. ..................................... 711/173
(58) Field of Classification Search ............. 711/173, 711/105, 118; 714/728, 739
See application file for complete search history.

(56) References Cited

U.S. PATENT DOCUMENTS

| 5,490,155 | A * | 2/1996 | Abdoo et al. ............... 714/763 |
| 6,819,129 | B1 | 11/2004 | Kim et al. |
| 6,845,472 | B1 | 1/2005 | Walker et al. |
| 6,851,074 | B1 | 2/2005 | Miloiicic et al. |
| 2004/0225944 | A1 * | 11/2004 | Brueggen ................... 714/758 |

OTHER PUBLICATIONS

"Soft Memory Errors and Their Effect on Sun Fire™ Systems", Sun Microsystems, Inc., Santa Clara, CA, Part No. 816-5053-10, Apr. 2002, Revision A; pp. 1-8.

* cited by examiner

*Primary Examiner*—Pierre Bataille
*Assistant Examiner*—Sheng-Jen Tsai
(74) *Attorney, Agent, or Firm*—Meyertons Hood Kivlin Kowert & Goetzel, P.C.; B. Noël Kivlin

(57) ABSTRACT

A method and apparatus for generating bits for a diagnostic routine of a memory subsystem. A memory device may be divided into n subdivisions of m bits each. Alternatively, n memory devices may each have m bits (in width). The system may also have a cache line having a certain number of check words. A diagnostic routine may begin with the generating one of $2^m$ bit patterns and assigning m bits of the generated bit pattern to one of the check words in the cache line. Each of the m bits assigned to the check word in the cache line may have the same logic value. However, each bit of the n subdivisions may be associated with a different check word in the cache line with respect to other bits of the subdivision. The method may be repeated for each of the $2^m$ bit patterns that may be generated.

15 Claims, 3 Drawing Sheets

METHOD AND APPARATUS FOR GENERATING GENERIC DESCRAMBLED DATA PATTERNS FOR TESTING ECC PROTECTED MEMORY

BACKGROUND OF THE INVENTION

1. Field of the Invention

This invention relates to computer systems, and more particularly, to diagnostic testing of memory systems.

2. Description of the Related Art

Computers and other electronic systems often undergo diagnostic routines. Diagnostic routines may be performed to ensure the functionality of various devices and interconnections within the system, and may also be used to isolate failing devices.

Memory subsystems are an integral part of computer system and many other types of electronic subsystems and are thus subject to diagnostic testing. In testing memory subsystems, it is desirable to have the ability to detect failures of individual memory devices, such as an individual DRAM (dynamic random access memory). In order to ensure that the failure of an individual memory device is detected, it is sometime necessary to apply a number of diagnostic patterns to the device. For at least some of these patterns, it is desirable that they include both a number of logic 1's and logic 0's.

Many memory subsystems include an error correction subsystem which may implement error correction codes (ECC). An ECC may generate one or more check bits that are associated with a data block. Error correction codes may be used to determine the presence of an error in a data block. Typical ECC subsystems may detect and correct single bit errors in a given memory block (SEC), and may also detect double bit errors in the memory block (DED). Some ECC subsystems may also include the capability of 4-bit nibble error detection (S4ED). In order to perform these error detection/correction functions, it may be necessary that bits from a given memory device are routed to different check words. In some cases however, the need to route bits from a given memory device to different check words may constrain the ability to assign bits for diagnostic routines. In particular, such constraints may in some cases result in bit assignments that result in diagnostic patterns where each bit assigned to a given memory device has the same logic value. Such diagnostic patterns may be unsatisfactory for detecting a failing memory device.

SUMMARY OF THE INVENTION

A method and apparatus for assigning bits for a diagnostic routine to a memory subsystem is disclosed. In one embodiment, a memory device of a computer system may be divided into n subdivisions of m bits each, while in another embodiment the n memory devices may each have m bits (m is the width of the subdivisions/memory devices). The computer system may also include a cache memory having a cache line having a certain number of check words. As used herein, the term "check word" refers to a word in a cache line that may include check bits and associated data bits that are protected by the check bits. Performing a diagnostic routine may begin with the generating one of $2^m$ bit patterns and assigning m bits of the generated bit patterns to check words in the cache line. Each of the m bits assigned to the check words in the cache line may have the same logic value. However, each bit of the n subdivisions (or n memory devices) may be associated with a different check word in the cache line with respect to other bits of the subdivision (or memory device). Thus, while the logic values of the bits in each check word of the cache line may be the same, the logic values associated with each memory device or subdivision may be mixed. The method may be repeated for each of the $2^m$ bit patterns that may be generated. Diagnostic tests may be run for each of the generated bit patterns.

BRIEF DESCRIPTION OF THE DRAWINGS

Other aspects of the invention will become apparent upon reading the following detailed description and upon reference to the accompanying drawings in which.

Figure 1A:
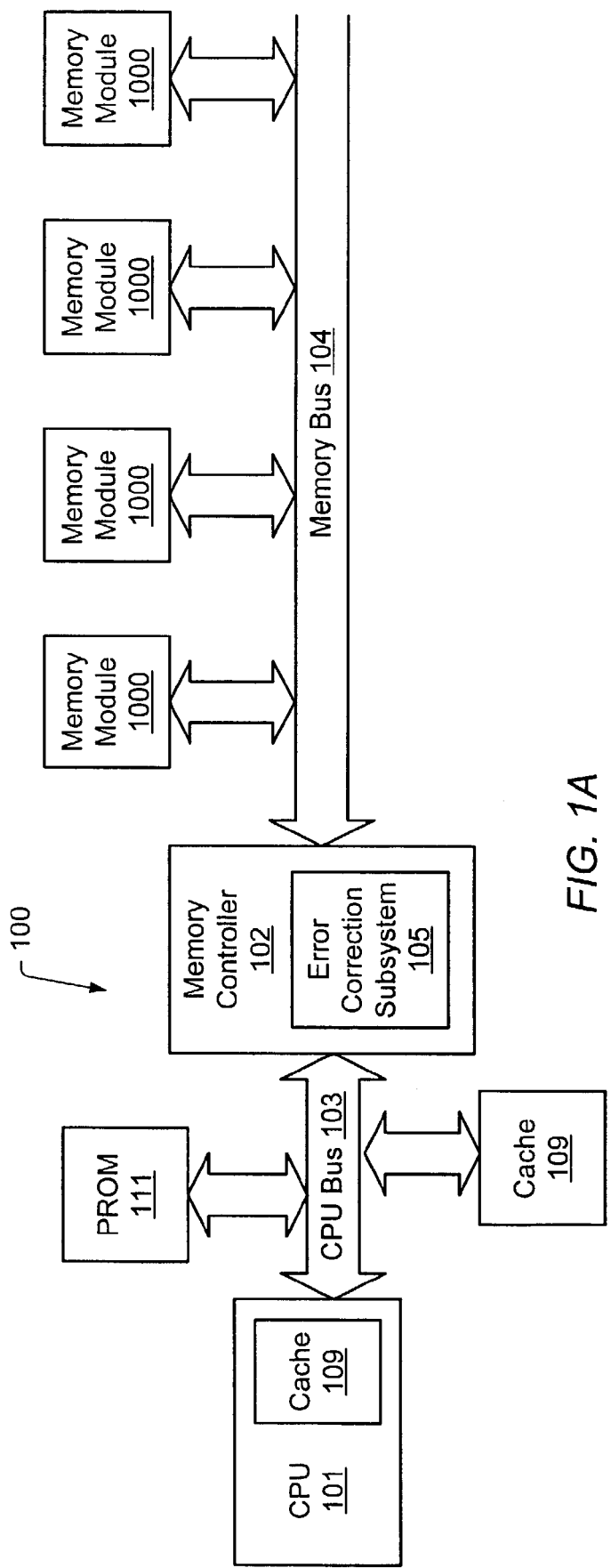
FIG. 1A is a block diagram of one embodiment of a computer system.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1A, a block diagram of one embodiment of a computer system is shown. In the embodiment shown includes central processing unit (CPU) 101, which is coupled to memory controller 102 by CPU bus 103. Embodiments having multiple processors are possible and contemplated. Memory controller 102 is coupled to a plurality of memory modules 1000 via memory bus 104. An error correction subsystem 104 may be included in memory controller 102. Computer system 100 may also include a cache memory 109, which may be located within CPU 101 or external to CPU 101. Some embodiments may include both internal and external cache memories.

Computer system 100 also includes programmable read-only memory (PROM) 111 in the embodiment shown. PROM 111 may include instructions that, when executed by CPU 101, may perform various types of diagnostic testing. Such diagnostic testing may include memory tests, include the tests of memory devices located on memory modules 1000, memory bus tests, and memory interconnect tests. In order to perform such diagnostic testing, the instructions located within PROM 111 may cause the generation of various bit patterns. These bit patterns may be generated within certain constraints, such as routing constraints resulting from the presence of error correction subsystem 105. Other means of generating the bit patterns (in lieu of the PROM) are possible and contemplated for other embodiments. For example, in another embodiment the diagnostics may be an application run under the control of an operating system. Generation and assignment of these bit patterns will be discussed in further detail below.

Figure 1B:
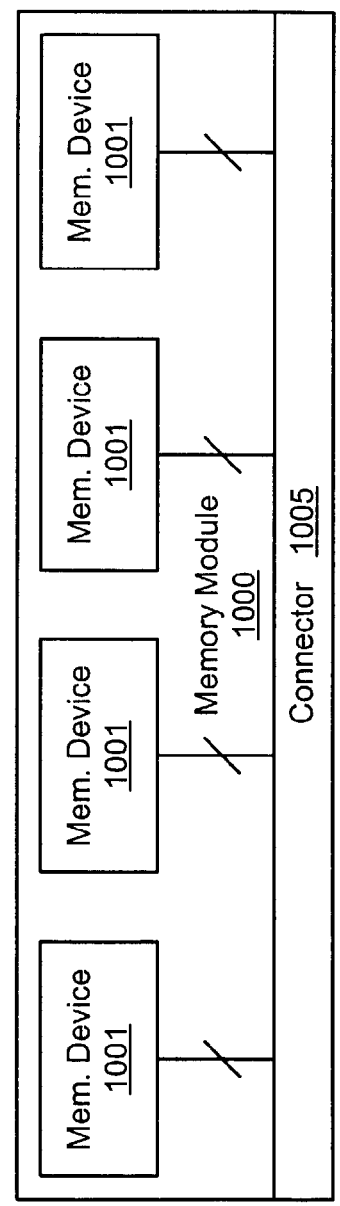
FIG. 1B is a block diagram of one embodiment of a memory module.

Moving now to FIG. 1B, a block diagram of one embodiment of a memory module is shown. Memory module 1000 may be a memory module used in computer system 100 as discussed above. In the embodiment shown, memory module 1000 includes a plurality of memory devices 1001. These memory devices may be one of several different types of memory, including dynamic random access memory (DRAM). Memory devices 1001 may be electrically connected to connector 1005, which may in turn couple memory module 1000 to a memory bus. Computer system 100 may include a plurality of memory modules 1000 which may be used to provide storage for data and instructions during the execution of programs running on the system.

Figure 2:
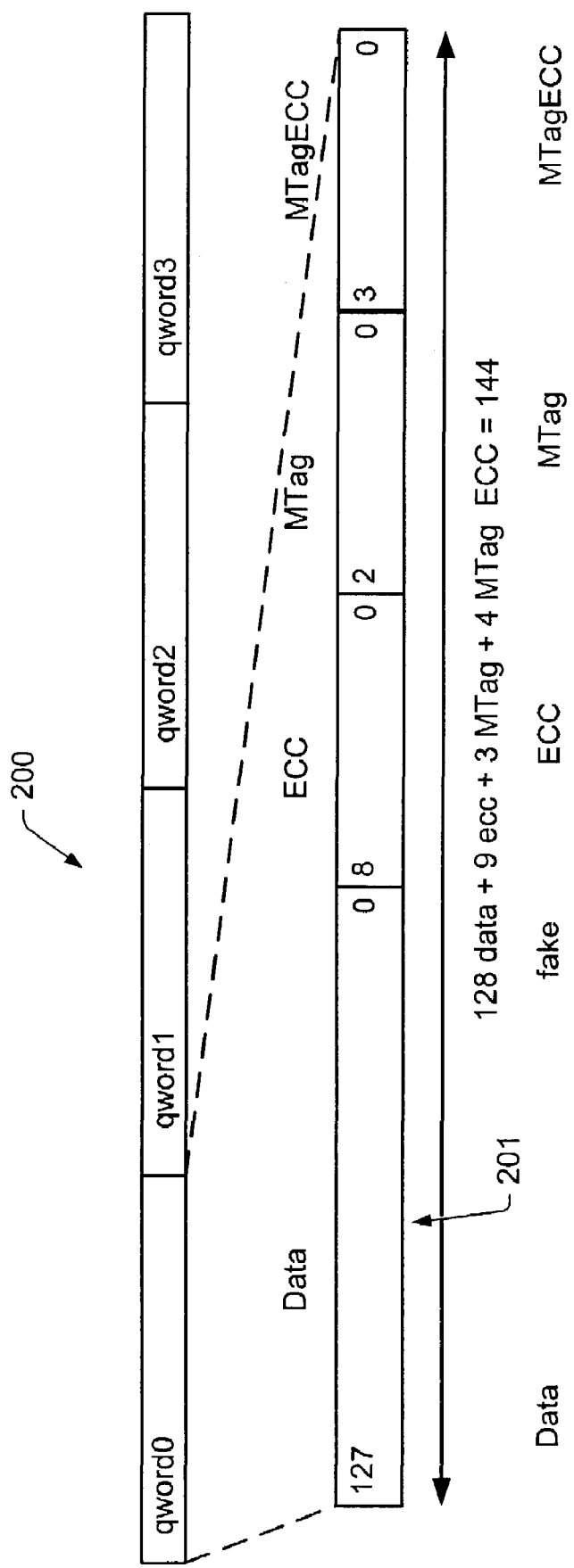
FIG. 2 is a block diagram illustrating one embodiment of a cache line and a check word associated with the cache line.

FIG. 2 is a block diagram illustrating one embodiment of a cache line and associated check words. The cache line may represent an amount of data that may be written or read from memory in one access. In the embodiment shown, cache line 200 is 4 check words (shown here as qwords, or quadwords) in width. For the purposes of this disclosure, the term "check word" includes both check bits and the data bits that are protected by the check bits, and may include additional bits as well. For this particular embodiment, each check word includes a total of 144 bits, although embodiments having larger or smaller check word sizes are possible and contemplated. Similarly, cache lines having a greater or lesser number of check words are also possible and contemplated.

As noted above, each check word of the cache line in the embodiment shown includes 144 bits. Of these 144 bits, 128 bits are data bits. Each check word also includes 9 bits of an error correction code (ECC). These 9 bits provide error protection for the 128 data bits. Each check word may also include extra bits (such as the MTag and MTagECC bits) which are used for other purposes, or may be reserved for future use.

An error correction subsystem, such as error correction subsystem 105 may read the data bits and ECC of check word 200 to determine whether one or more data bits of the check word are in error. Various techniques may be used in order to determine the presence or absence of a data error. In some embodiments, the ECC used is known as an SEC-DED-S4ED code—single error correcting, double error detecting, 4-bit nibble error detecting. In addition to detecting errors within a specific check word, it is desirable to be able to detect errors associated with specific memory devices. Increasing the likelihood of detecting errors associated with specific memory devices places additional routing constraints on signal lines to and from each memory device. These constraints will now be illustrated below in reference to FIG. 3.

Figure 3:
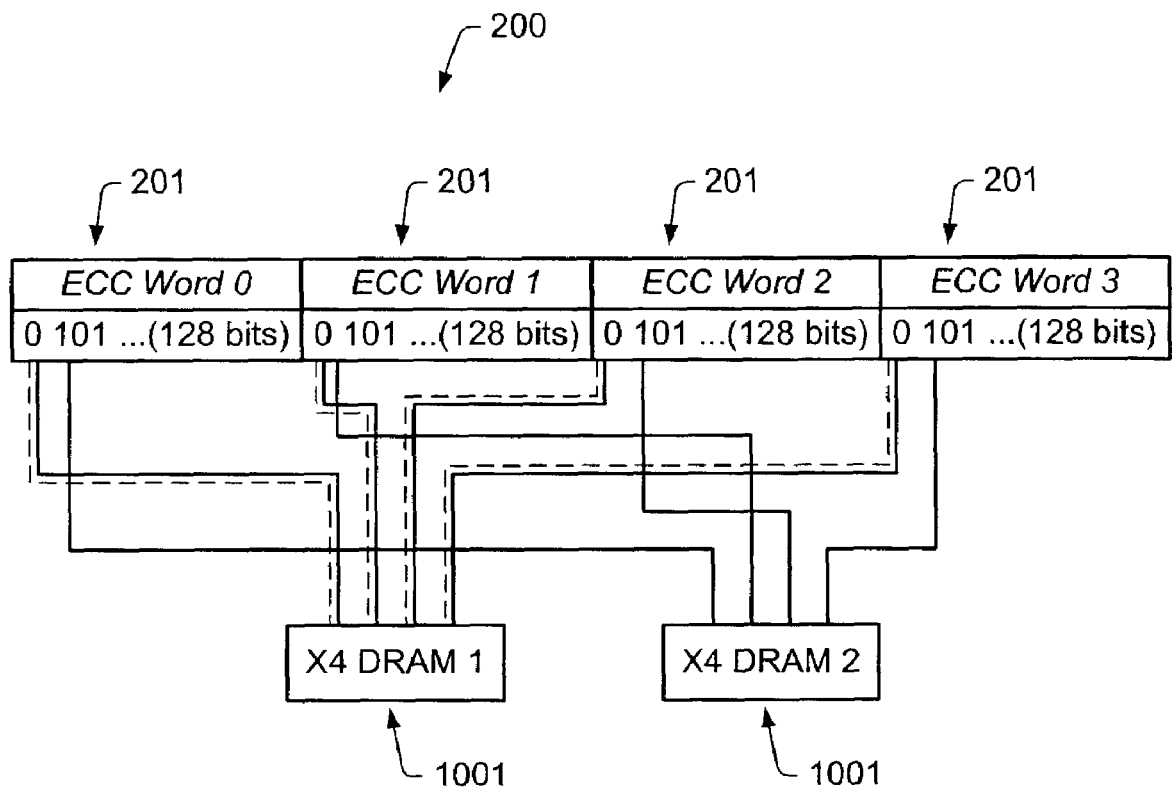
FIG. 3 is a block diagram illustrating the association of check words and memory devices.

FIG. 3 is a block diagram illustrating the association of error correction codes (ECCs) and memory devices. In the embodiment shown, two memory devices 1001 are shown are providing bits to each of the check words 201 in cache line 200. In this particular example, memory devices 1001 are 4 bits in width (i.e. 4 bits are read from the device in any given cycle). However, other embodiments are possible and contemplated wherein a larger memory device (e.g., 16 bits in width) may be viewed as being subdivided into smaller devices, such as the 4-bit devices shown.

As shown in FIG. 3, each of the 4-bit memory devices provides a bit to each of the 4 check words in cache line 200. Thus, in this particular case, no two bits from the same memory device 1001 are present in the same check word 201 of cache line 200. Thus, it is possible that if one of memory devices 1001 completely fails, the error correction subsystem may detect and correct 4 single-bit errors, one in each check word. By identifying the bit location of each of the errors, it may be possible to identify the failing memory chip. This is one method of implementing a chip-kill correct DIMM. Chip-kill correct functionality may allow a memory system to recover from an event where a single memory device fails.

It should be noted that, although 4-bit memory devices are shown here, other embodiments are possible and contemplated using larger devices, such as a 16-bit device which may be subdivided into four 4-bit devices (in the case where the cache line has 4 check words). Specific device size and any subdivision size may be different for other embodiments based on check word size (in bits) as well as the size of the cache line (in number of check words).

Due to the routing constraints that may exist in ensuring bits from different devices (or subdivisions of a device) are assigned to different check words of a cache line, it may be necessary to ensure that diagnostic patterns are generated such that the data bit patterns written on a chip do not always write the same logic values to a given memory device. A method for achieving this goal is discussed in further detail below in reference to FIG. 4.

Figure 4:
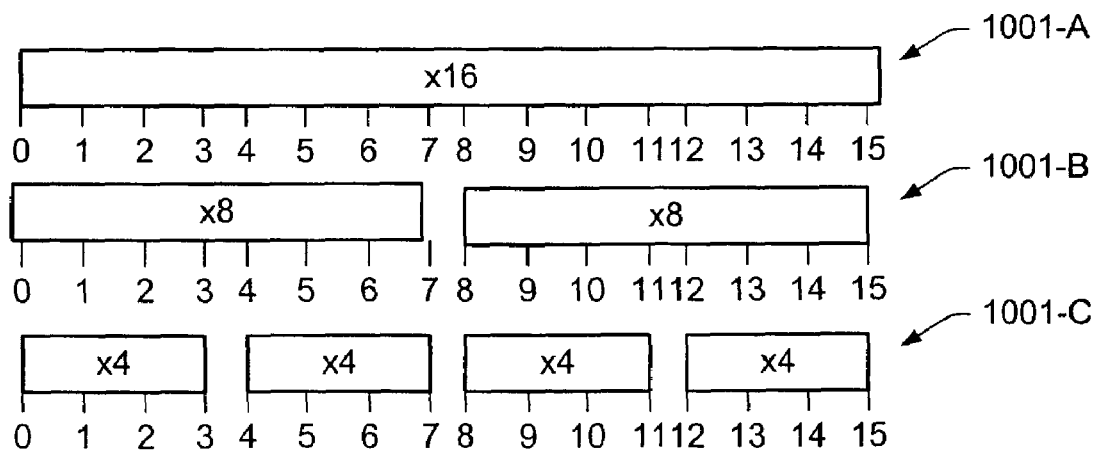
FIG. 4 is a block diagram illustrating various memory devices and potential subdivisions thereof.

Moving now to FIG. 4 is a block diagram illustrating various memory devices and potential subdivisions thereof. In the drawing shown here, embodiments of three different memory devices are shown: 16-bit memory 1001-A, 8-bit memories 1001-B and 4-bit memories 1001-C. The bit number for each of these memories is indicative of the number of bits that may be written or read during a memory cycle. Any of the embodiments shown may be used to read/write data in 16-bit blocks, although a combination of devices must be provided to achieve this objective for 8-bit memories 1001-B and 4-bit memories 1001-C.

Memory devices of larger sizes may be subdivided into smaller sized memories for the purposes of performing error detection and correction, particularly in cases wherein the ECC is an SEC-DED-S4ED code. Thus, 16-bit memory 1001-A may be viewed as four 4-bit memory devices, where each of the 4-bit memory devices is associated with four of the 16 bits of a 16-bit data block. Conversely, four 4-bit memory devices 1001-C may be associated with single 16-bit data block as shown, and may thus be viewed as a single 16-bit memory device. In general, grouping bits of a data block into groups of 4 may make the memory subsystem suitable for 4-bit nibble error detection (S4ED) by an error correction subsystem. It should also be noted that memory device sizes and subdivision sizes other than those discussed here are possible and contemplated.

It should be noted that embodiments are possible and contemplated using ECC subsystems having a different number of check bits, different error detection and correction codes, and different error detection and correction capabilities.

As noted above, bit assignments (i.e. assignment of various bit positions of a data block) to check words of a cache line may be performed such that each bit of the device is assigned to a different check word of the cache line. Table 1 illustrates one such embodiment, wherein 16-bit memory devices are subdivided into groups of 4 bits, and wherein each bit of a 4-bit subdivision is assigned to a different check word of the cache line. The left most column lists the signals for each of the check words, while the remaining columns list the memory device and pin number to which those signals are routed to/from. For example, data bits 8, 9, 10, and 11 for check word 0 (QWord 0) is associated with memory device D4, bits 14, 9, 4, and 3. For check word 1 of the cache line, data bits 8, 9, 10, and 11 are associated with D4, bits 15, 8, 5, and 2.

TABLE 1

| signal (nibbles) | QWord 0 | QWord1 | QWord2 | QWord3 |
| --- | --- | --- | --- | --- |
| MTagECC[0,1,2,3] | D[0,1,2,3][0] | D[0,1,2,3][1] | D[0,1,2,3][2] | D[0,1,2,3][3] |
| MTag[0,1,2] | D[0,1,2][7] | D[0,1,2][6] | D[0,1,2][5] | D[0,1,2][4] |
| ECC[4] | D[0][10] | D[0][11] | D[0][8] | D[0][9] |
| Data[0,1,2,3] | D[3][7,10,13],D[1][10] | D[3][6,11,12],D[1][11] | D[3][5,8,15],D[1][8] | D[3][4,9,14],D[1][9] |
| Data[4,5,6,7] | D[2][10],D[0,1,2][13] | D[2][11],D[0,1,2][12] | D[2][8],D[0,1,2][15] | D[2][9],D[0,1,2][14] |
| Data[8,9,10,11] | D[4][14,9,4,3] | D[4][15,8,5,2] | D[4][12,11,6,1] | D[4][13,10,7,0] |
| Data[12,13,14,15] | D[5][14,9,4,3] | D[5][15,8,5,2] | D[5][12,11,6,1] | D[5][13,10,7,0] |
| Data[16,17,18,19] | D[6][14,9,4,3] | D[6][15,8,5,2] | D[6][12,11,6,1] | D[6][13,10,7,0] |
| Data[20,21,22,23] | D[7][14,9,4,3] | D[7][15,8,5,2] | D[7][12,11,6,1] | D[7][13,10,7,0] |
| Data[24,25,26,27] | D[8][0,7,10,13] | D[8][1,6,11,12] | D[8][2,5,8,15] | D[8][3,4,9,14] |
| Data[28,29,30,31] | D[9][14,9,4,3] | D[9][15,8,5,2] | D[9][12,11,6,1] | D[9][13,10,7,0] |
| Data[32,33,34,35] | D[10][14,9,4,3] | D[10][15,8,5,2] | D[10][12,11,6,1] | D[10][13,10,7,0] |
| Data[36,37,38,39] | D[11][14,9,4,3] | D[11][15,8,5,2] | D[11][12,11,6,1] | D[11][13,10,7,0] |
| Data[40,41,42,43] | D[12][14,9,4,3] | D[12][15,8,5,2] | D[12][12,11,6,1] | D[12][13,10,7,0] |
| Data[44,45,46,47] | D[13][14,9,4,3] | D[13][15,8,5,2] | D[13][12,11,6,1] | D[13][13,10,7,0] |
| Data[48,49,50],ECC[2] | D[14][14,9,4,3] | D[14][15,8,5,2] | D[14][12,11,6,1] | D[14][13,10,7,0] |
| Data[51,52,53],ECC[1] | D[15][14,9,4,3] | D[15][15,8,5,2] | D[15][12,11,6,1] | D[15][13,10,7,0] |
| Data[54,55],ECC[3,0]] | D[16][14,9,4,3] | D[16][15,8,5,2] | D[16][12,11,6,1] | D[16][13,10,7,0] |
| Data[56,57,58,59] | D[17][14,9,4,3] | D[17][15,8,5,2] | D[17][12,11,6,1] | D[17][13,10,7,0] |
| Data[60,61,62,63] | D[18][0,7,10,13] | D[18][1,6,11,12] | D[18][2,5,8,15] | D[18][3,4,9,14] |
| Data[64,65,66,67] | D[19][0,7,10,13] | D[19][1,6,11,12] | D[19][2,5,8,15] | D[19][3,4,9,14] |
| Data[68,69,70,71] | D[20][0,7,10,13] | D[20][1,6,11,12] | D[20][2,5,8,15] | D[20][3,4,9,14] |
| ECC[8,5],Data[72,73] | D[21][14,9,4,3] | D[21][15,8,5,2] | D[21][12,11,6,1] | D[21][13,10,7,0] |
| ECC[7],Data[74,75,76] | D[22][14,9,4,3] | D[22][15,8,5,2] | D[22][12,11,6,1] | D[22][13,10,7,0] |
| ECC[6],Data[77,78,79] | D[23][14,9,4,3] | D[23][15,8,5,2] | D[23][12,11,6,1] | D[23][13,10,7,0] |
| Data[80,81,82,83] | D[24][14,9,4,3] | D[24][15,8,5,2] | D[24][12,11,6,1] | D[24][13,10,7,0] |
| Data[84,85,86,87] | D[25][14,9,4,3] | D[25][15,8,5,2] | D[25][12,11,6,1] | D[25][13,10,7,0] |
| Data[88,89,90,91] | D[26][14,9,4,3] | D[26][15,8,5,2] | D[26][12,11,6,1] | D[26][13,10,7,0] |
| Data[92,93,94,95] | D[27][14,9,4,3] | D[27][15,8,5,2] | D[27][12,11,6,1] | D[27][13,10,7,0] |

It should be noted that Table 1 is associated with an embodiment similar to the one described in FIG. 2, wherein each check word of the cache line is 144 bits wide. It should also be noted that Table 1 shows only a portion of the bit assignments for each of 144-bit check words of the cache line. An alternate routing scheme is shown, in part, in Table 2.

TABLE 2

| signal (nibbles) | QWord 0 | QWord1 | QWord2 | QWord3 |
| --- | --- | --- | --- | --- |
| MTagECC[0,1,2,3] | D[0,1,2,3][14] | D[0,1,2,3][15] | D[0,1,2,3][12] | D[0,1,2,3][13] |
| MTag[0,1,2] | D[0,1,2][9] | D[0,1,2][8] | D[0,1,2][11] | D[0,1,2][10] |
| ECC[4] | D[0][4] | D[0][5] | D[0][6] | D[0][7] |
| Data[0,1,2,3] | D[3][9,4,3],D[1][4] | D[3][8,5,2],D[1][5] | D[3][11,6,1]D[1][6] | D[3][10,7,0],D[1][7] |
| Data[4,5,6,7] | D[2][4],D[0,1,2][3] | D[2][5],D[0,1,2][2] | D[2][6],D[0,1,2][1] | D[2][7],D[0,1,2][0] |
| Data[8,9,10,11] | D[4][0,7,10,13] | D[4][1,6,11,12] | D[4][2,5,8,15] | D[4][3,4,9,14] |
| Data[12,13,14,15] | D[5][0,7,10,13] | D[5][1,6,11,12] | D[5][2,5,8,15] | D[5][3,4,9,14] |
| Data[16,17,18,19] | D[6][0,7,10,13] | D[6][1,6,11,12] | D[6][2,5,8,15] | D[6][3,4,9,14] |
| Data[20,21,22,23] | D[7][0,7,10,13] | D[7][1,6,11,12] | D[7][2,5,8,15] | D[7][3,4,9,14] |
| Data[24,25,26,27] | D[8][14,9,4,3] | D[8][15,8,5,2] | D[8][12,11,6,1] | D[8][13,10,7,0] |
| Data[28,29,30,31] | D[9][0,7,10,13] | D[9][1,6,11,12] | D[9][2,5,8,15] | D[9][3,4,9,14] |
| Data[32,33,34,35] | D[10][0,7,10,13] | D[10][1,6,11,12] | D[10][2,5,8,15] | D[10][3,4,9,14] |
| Data[36,37,38,39] | D[11][0,7,10,13] | D[11][1,6,11,12] | D[11][2,5,8,15] | D[11][3,4,9,14] |
| Data[40,41,42,43] | D[12][0,7,10,13] | D[12][1,6,11,12] | D[12][2,5,8,15] | D[12][3,4,9,14] |

For the embodiment of Table 2, data bits 8, 9, 10, and 11 of check word 0 may be associated with memory device D4, bits 0, 7, 10, and 13, data bits 8, 9, 10, and 11 of check word 1 may be associated with D4, bits 1, 6, 11, and 12, and so on.

As the difference between Table 1 and Table 2 demonstrates, routing of bits of system memory devices to check words in a cache line may vary from platform to platform. Furthermore, the routing of bits from memory devices to check words in a cache line may vary within the same platform. For example, Table 1 shown above may represent the routing assignments for a first side of a DIMM (dual inline memory module) while Table 2 may represent the routing for the second side of the DIMM.

Since the routing assignments may change from platform to platform, and may even vary on a given platform, it may be necessary to ensure that bit patterns generated for diagnostic tests are generated in such a manner that each device/subdivision will see all relevant bit patterns.

One embodiment of a method for generating bit patterns such that each device/subdivision will see all of the relevant bit patterns includes generating $2^m$ bit patterns, wherein m is the number of bits of each device/subdivision. For example, m=4 for the embodiments associated with Tables 1 and 2 shown above, since the size of each of the subdivisions is 4 bits. In cases where the memory device is larger (in width) than the bit-width of each of the groupings, the memory device may be subdivided into n subdivisions. For the embodiment described herein, n=4 for a 16-bit memory device divided into 4 subdivisions of 4 bits each. However, it should be noted that embodiments having different values for m and n are possible and contemplated.

In one embodiment, the number of subdivisions of a memory device may be equal to the number of check words in the cache line. Such is the case in this embodiment, wherein the cache line includes 4 check words, and wherein each 16-bit memory device includes four 4-bit subdivisions. In other embodiments, the number of check words in the cache line may not necessarily be equal to the number of subdivisions of each memory device.

In some embodiments, the memory devices may not be subdivided. In such cases, while n may indicate the number of check words in the cache line, it is not applicable to the memory devices since there are no subdivisions.

In embodiments where subdivisions of a memory device are performed, the subdivisions are performed according to significance of the bits in each grouping. For example, in a 16-bit device, the first subdivision may include bits 0–3, while the second subdivision includes bits 4–7, the third subdivision includes bits 8–11, and the fourth subdivision includes bits 12–15. Each bit of a given subdivision may be assigned to a different check word of the cache line with respect to each of the other bits of the subdivision.

Once a bit pattern has been generated bits may be assigned to both a memory device/subdivision and to each check word in the cache line. Each of the m bits of a memory device subdivision may be assigned to a different check word of the cache line, so that no check word includes more than one bit from that particular subdivision. In the case where memory devices are not subdivided, the assignments of each of the m bits of the device may ensure that no check word in the cache line is associated more than one bit of that device. In the example shown herein, since m=4 and n=4, one bit from each subdivision may be assigned to each check word of the cache line.

The bit patterns generated for one embodiment are shown below in Table 3. Other embodiments are possible and contemplated, and may vary in both the size and number of bit patterns based on factors such as the number of check words in the cache line. These bit patterns are assigned to the check words of the cache line. Thus, the assignment of bit patterns to each memory device may vary depending on the platform. For example, while the bit assignments to specific memory devices may be different for the routing scheme illustrated in Table 1 with respect to the routing scheme illustrated in Table 2. However, either of the embodiments illustrated in FIGS. 1 and 2 may utilize the bit patterns illustrated in Table 3.

The bit patterns shown in the embodiment of Table 3 include $2^m$ (where m=4 and $2^m$=16 in this case) basic bit patterns. Individual bits of the basic bit pattern may be repeated in their assignment to each of the check words of the cache line. For example, where the basic bit pattern is 0011, logic 0's are assigned to all bit positions in check words 0 and 1, while logic 1's are assigned to all bit positions in check words 2 and 3. Similarly, if the basic bit pattern is 1001, logic 0's are assigned to all bit positions in check words 1 and 2, while logic 1's are assigned to all bit positions in check words 0 and 3.

TABLE 3

| Basic Patterns | Check word 0 | Check word 1 | Check word 2 | Check word 3 |
|---|---|---|---|---|
| 0000 | All 0's | All 0's | All 0's | All 0's |
| 0001 | All 0's | All 0's | All 0's | All 1's |
| 0010 | All 0's | All 0's | All 1's | All 0's |
| 0011 | All 0's | All 0's | All 1's | All 1's |
| 0100 | All 0's | All 1's | All 0's | All 0's |
| 0101 | All 0's | All 1's | All 0's | All 1's |
| 0110 | All 0's | All 1's | All 1's | All 0's |
| 0111 | All 0's | All 1's | All 1's | All 1's |
| 1000 | All 1's | All 0's | All 0's | All 0's |
| 1001 | All 1's | All 0's | All 0's | All 1's |
| 1010 | All 1's | All 0's | All 1's | All 0's |
| 1011 | All 1's | All 0's | All 1's | All 1's |
| 1100 | All 1's | All 1's | All 0's | All 0's |
| 1101 | All 1's | All 1's | All 0's | All 1's |
| 1110 | All 1's | All 1's | All 1's | All 0's |
| 1111 | All 1's | All 1's | All 1's | All 1's |

For the embodiments discussed above, each 4-bit memory device or 4-bit subdivision may be associated with one bit to each check word of the cache line. Thus, while each check word in the cache line may be comprised of all logic 0's or all logic 1's according to the generated bit patterns, each device may be associated with logic 0's and logic 1's. For example, for the bit pattern 0011, a given device may provide two logic 0's and two logic 1's.

Table 4 below illustrates the association of patterns with device D4 according to the routing assignments of Table 1. In this particular embodiment, each group of four bit positions (0–3, 4–7, 8–11, and 12–15) provides a single bit to each of the four check words of the cache line. For example, taking the group of bit positions 12–15, 12 is associated with check word 2, 13 is associated with check word 3, 14 is associated with check word 0, and 15 is associated with check word 1.

TABLE 4

Patterns associated with Device D4 according to the routing assignments of Table 1

| | Bit #'s | | | | | | | | | | | | | | | |
|---|---|---|---|---|---|---|---|---|---|---|---|---|---|---|---|---|
| | 15 | 14 | 13 | 12 | 11 | 10 | 9 | 8 | 7 | 6 | 5 | 4 | 3 | 2 | 1 | 0 |
| Basic Patterns | W1 | W0 | W3 | W2 | W2 | W3 | W0 | W1 | W3 | W2 | W1 | W0 | W0 | W1 | W2 | W3 |
| 0000 | 0 | 0 | 0 | 0 | 0 | 0 | 0 | 0 | 0 | 0 | 0 | 0 | 0 | 0 | 0 | 0 |
| 0001 | 0 | 0 | 1 | 0 | 0 | 1 | 0 | 0 | 1 | 0 | 0 | 0 | 0 | 0 | 0 | 1 |
| 0010 | 0 | 0 | 0 | 1 | 1 | 0 | 0 | 0 | 0 | 1 | 0 | 0 | 0 | 0 | 1 | 0 |
| 0011 | 0 | 0 | 1 | 1 | 1 | 1 | 0 | 0 | 1 | 1 | 0 | 0 | 0 | 0 | 1 | 1 |

TABLE 4-continued

Patterns associated with Device D4 according to the routing assignments of Table 1

| | Bit #'s | | | | | | | | | | | | | | | |
|---|---|---|---|---|---|---|---|---|---|---|---|---|---|---|---|---|
| | 15 | 14 | 13 | 12 | 11 | 10 | 9 | 8 | 7 | 6 | 5 | 4 | 3 | 2 | 1 | 0 |
| 0100 | 1 | 0 | 0 | 0 | 0 | 0 | 0 | 1 | 0 | 0 | 1 | 0 | 0 | 1 | 0 | 0 |
| 0101 | 1 | 0 | 1 | 0 | 0 | 1 | 0 | 1 | 1 | 0 | 1 | 0 | 0 | 1 | 0 | 1 |
| 0110 | 1 | 0 | 0 | 1 | 1 | 0 | 0 | 1 | 0 | 1 | 1 | 0 | 0 | 1 | 1 | 0 |
| 0111 | 1 | 0 | 1 | 1 | 1 | 1 | 0 | 1 | 1 | 1 | 1 | 0 | 0 | 1 | 1 | 1 |
| 1000 | 0 | 1 | 0 | 0 | 0 | 0 | 1 | 0 | 0 | 0 | 0 | 1 | 1 | 0 | 0 | 0 |
| 1001 | 0 | 1 | 1 | 0 | 0 | 1 | 1 | 0 | 1 | 0 | 0 | 1 | 1 | 0 | 0 | 1 |
| 1010 | 0 | 1 | 0 | 1 | 1 | 0 | 1 | 0 | 0 | 1 | 0 | 1 | 1 | 0 | 1 | 0 |
| 1011 | 0 | 1 | 1 | 1 | 1 | 1 | 1 | 0 | 1 | 1 | 0 | 1 | 1 | 0 | 1 | 1 |
| 1100 | 1 | 1 | 0 | 0 | 0 | 0 | 1 | 1 | 0 | 0 | 1 | 1 | 1 | 1 | 0 | 0 |
| 1101 | 1 | 1 | 1 | 0 | 0 | 1 | 1 | 1 | 1 | 0 | 1 | 1 | 1 | 1 | 0 | 1 |
| 1110 | 1 | 1 | 0 | 1 | 1 | 0 | 1 | 1 | 0 | 1 | 1 | 1 | 1 | 1 | 1 | 0 |
| 1111 | 1 | 1 | 1 | 1 | 1 | 1 | 1 | 1 | 1 | 1 | 1 | 1 | 1 | 1 | 1 | 1 |

For a large check word size (e.g., the 144-bit check words discussed above), a plurality of memory devices may be used to form the check words. However, since the devices or subdivisions may be small relative to the check word size, a relatively small number of bit patterns need be generated in order to perform an effective diagnostic test. In the embodiments discussed above, with four 144-bit check words in the cache line (and thus 576 bits total in the cache line) using 4-bit memory devices or 4-bit subdivisions may allow an effective diagnostic testing routine having a total of only 16 bit patterns. This may minimize the necessary testing time while ensuring that each bit position is toggled between a logic 0 and a logic 1 enough times to verify functionality (or the presence of an error). Generating bits in accordance with an embodiment of the method illustrated by Table 3 may be generic, i.e. it may be applied to various platforms with different routing schemes, such as the alternate scheme illustrated in Table 2, while ensuring that each bit position is toggled between a logic 0 and a logic 1 several times.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for generating bits of a diagnostic routine to a memory subsystem, the method comprising:
    generating $2^m$ bit patterns, each bit pattern having m bits; and
    writing each of m bits of a given bit pattern to each of a plurality of memory units, wherein a given bit of the m bits is written to a different position in each of the memory units;
    wherein each of the m bits in each memory unit is associated with a different one of a plurality of check words in a cache line, and wherein each bit of a given check word has a logic value equal to every other bit of the given check word regardless of which of the $2^m$ bit patterns has been generated;
    wherein the method further includes performing a diagnostic routine by reading each of the check words and detecting whether an error exists based on an error correction code of each of the check words.

2. The method as recited in claim 1, wherein m=4.

3. The method as recited in claim 2, wherein each unit of memory is comprised in a memory device 16 bits wide, and wherein the memory device is subdivided into four units four bits in width each.

4. The method as recited in claim 1, wherein each unit of memory is a memory device.

5. The method as recited in claim 4, wherein the memory device is a random access memory (RAM).

6. The method as recited in claim 5, wherein the memory device is a dynamic RAM (DRAM) having a width of four bits.

7. A computer system including a memory subsystem, the computer system comprising:
    a memory controller;
    a cache memory coupled to the memory controller, wherein the cache memory is associated with a cache line having a plurality check words; and
    a plurality of memory devices coupled to the memory controller by a memory bus;
    wherein the computer system is configured to generate bit patterns for performing a diagnostic routine on the memory subsystem, said generating including:
    generating $2^m$ bit patterns, each bit pattern having m bits; and
    writing each of m bits of a given bit pattern to each of a plurality of memory units, wherein a given bit of the m bits is written to a different position in each of the memory units;
    wherein each of the m bits in each memory unit is associated with a different one of the plurality of check words, wherein each bit of a given one of the plurality of check words has a logic value equal to every other bit of the given one of the plurality of check words regardless of which of the $2^m$ bit patterns has been generated;
    wherein the memory subsystem is configured to perform a diagnostic test by reading each of the check words and detecting whether an error exists based on an error correction code of each of the check words.

8. The computer system as recited in claim 7, wherein the cache is an external cache.

9. The computer system as recited in claim 7, wherein the cache is located in a processor, wherein the processor is coupled to the memory controller by a CPU bus.

10. The computer system as recited in claim 7, wherein m=4.

11. The computer system as recited in claim 10, wherein each unit of memory is comprised in one of the plurality of memory devices, wherein each of the plurality of memory devices is 16 bits wide, and wherein each of the plurality of memory devices is subdivided into four units of four bits each.

12. The computer system as recited in claim 7, wherein each unit of memory corresponds to one of the plurality of memory devices, wherein each of the plurality of memory devices has a width of four bits.

13. The computer system as recited in claim 7, wherein the memory controller includes an error correction subsystem.

14. The computer system as recited in claim 7, wherein each of the plurality of memory devices is a random access memory (RAM).

15. The computer system as recited in claim 14, wherein each of the plurality of memory devices is a dynamic RAM (DRAM).

* * * * *